(12) United States Patent
Nam et al.

(10) Patent No.: US 7,791,164 B2
(45) Date of Patent: Sep. 7, 2010

(54) ELECTRICAL FUSE, SEMICONDUCTOR DEVICE HAVING THE SAME, AND METHOD OF PROGRAMMING AND READING THE ELECTRICAL FUSE

(75) Inventors: Myung-Hee Nam, Hwaseong-si (KR); Shigenobu Maeda, Seongnam-si (KR); Jae-Ho Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 221 days.

(21) Appl. No.: 11/951,585

(22) Filed: Dec. 6, 2007

(65) Prior Publication Data

US 2008/0150076 A1   Jun. 26, 2008

(30) Foreign Application Priority Data

Dec. 26, 2006   (KR) .................. 10-2006-0134045

(51) Int. Cl.
*H01L 27/00* (2006.01)
(52) U.S. Cl. ................. 257/529; 257/209; 257/E27.001
(58) Field of Classification Search .......... 257/529, 257/209, 530, E27.001; 438/132; 365/96
See application file for complete search history.

(56) References Cited

U.S. PATENT DOCUMENTS

| | | | |
|---|---|---|---|
| 5,896,395 A | 4/1999 | Lee | |
| 6,426,668 B1 | 7/2002 | Morrish et al. | |
| 6,552,549 B1 | 4/2003 | Kaiser et al. | |
| 6,570,806 B2 | 5/2003 | Bertin et al. | |
| 6,639,848 B2 | 10/2003 | Maejima | |
| 6,720,820 B1 | 4/2004 | Chuang et al. | |
| 6,747,481 B1 | 6/2004 | Pitts | |
| 6,804,156 B2 | 10/2004 | Ito | |
| 6,819,144 B2 | 11/2004 | Li et al. | |
| 6,883,717 B1 | 4/2005 | Kelley et al. | |
| 6,928,011 B2 | 8/2005 | Krishnan et al. | |
| 6,933,591 B1 | 8/2005 | Sidhu et al. | |
| 6,956,277 B1 | 10/2005 | Wu et al. | |
| 7,119,414 B2 * | 10/2006 | Hisaka | ........ 257/529 |
| 7,304,366 B2 * | 12/2007 | Wu et al. | ........ 257/529 |
| 7,529,147 B2 * | 5/2009 | Ueda | ........ 365/225.7 |
| 2005/0277232 A1 | 12/2005 | Wu et al. | |

FOREIGN PATENT DOCUMENTS

| | | |
|---|---|---|
| JP | 07-122646 | 5/1995 |
| JP | 2005-244101 | 9/2005 |
| JP | 2006-165332 | 6/2006 |

OTHER PUBLICATIONS

English Abstract for Publication No. 2005-244101.
English Abstract for Publication No. 2006-165332.
English Abstract for Publication No. 07-122646.

* cited by examiner

*Primary Examiner*—Roy K Potter
(74) *Attorney, Agent, or Firm*—F. Chau & Associates, LLC (57) ABSTRACT

Provided are an electrical fuse, a semiconductor device having the same, and a method of programming and reading the electrical fuse. The electrical fuse includes first and second anodes disposed apart from each other. A cathode is interposed between the first and second anodes. A first fuse link couples the first anode to the cathode, and a second fuse link couples the second anode to the cathode.

14 Claims, 6 Drawing Sheets

ELECTRICAL FUSE, SEMICONDUCTOR DEVICE HAVING THE SAME, AND METHOD OF PROGRAMMING AND READING THE ELECTRICAL FUSE

This application claims priority to Korean Patent Application No. 10-2006-0134045, filed Dec. 26, 2006, the contents of which are hereby incorporated by reference herein in their entirety.

BACKGROUND OF THE INVENTION

1. Technical Field

The present invention relates to an electrical fuse and, more particularly, to an electrical fuse, a semiconductor device having the same, and a method of programming and reading the electrical fuse.

2. Discussion of the Related Art

Semiconductor memory devices (chips) disposed on a semiconductor substrate are electrically tested before an assembly process. As a result, the semiconductor chips are classified as either defective or good. When a malfunction occurs in at least one defective cell of the defective chips, the defective cell is replaced by a redundant cell in a repair process. In order to allow the redundant cell to use an address of the defective cell in write and read modes, predetermined fuses are blown (for example, programmed) using the repair process. It may be confirmed whether the fuses are blown or not by sensing the resistance with the application of a voltage to both ends of each of the fuses on which the repair process is performed.

The fuses may be a laser fuse, which is blown using laser, or an electrical fuse, which is blown by applying a voltage.

Figure 1:
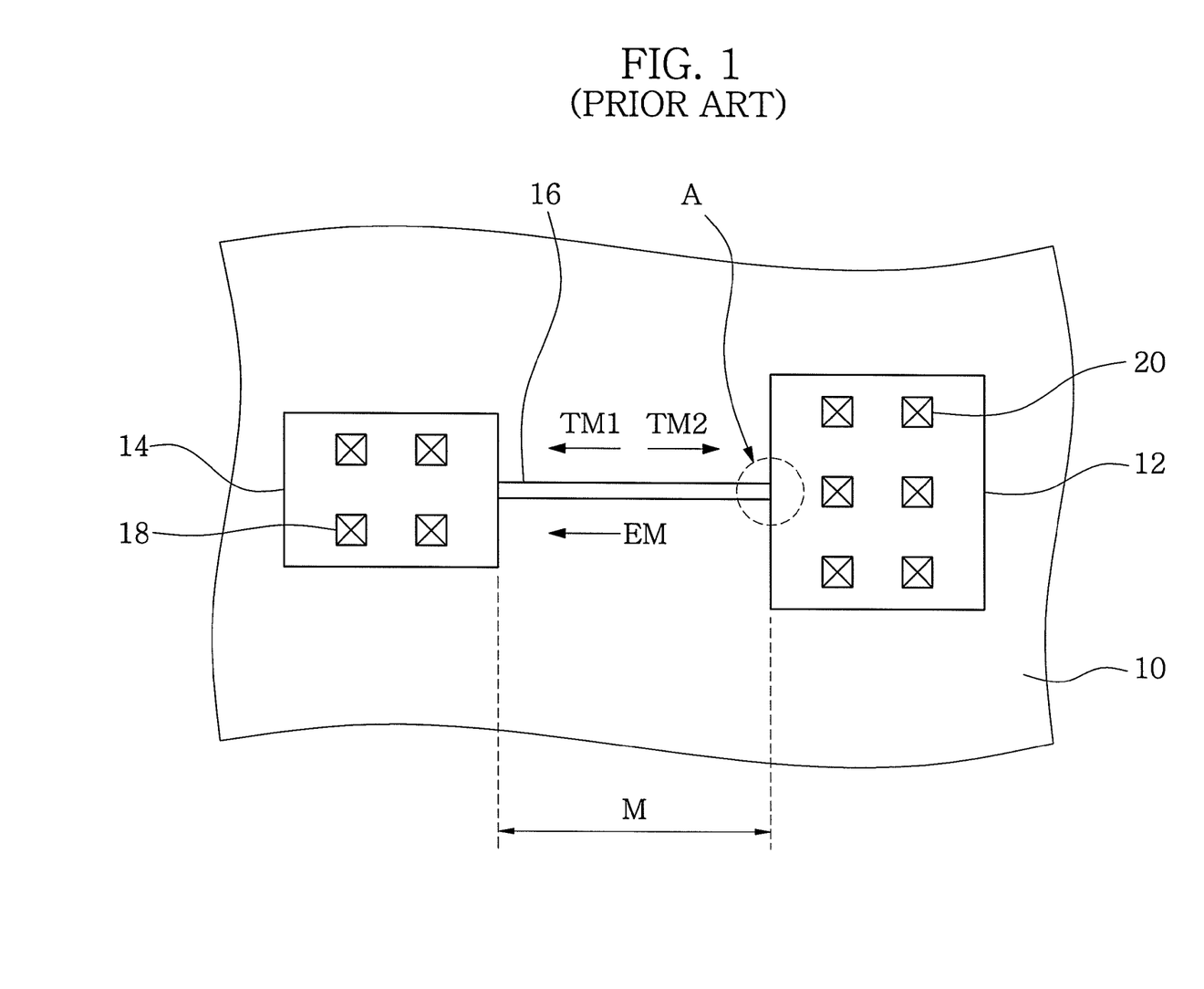
FIG. 1 is a plan view of a conventional electrical fuse.

FIG. 1 is a plan view of a conventional electrical fuse.

Referring to FIG. 1, the electrical fuse is disposed on a semiconductor substrate 10. The electrical fuse includes a cathode 12 and an anode 14, which are spaced apart from each other, and a fuse link 16, which combines the cathode 12 with the anode 14. For example, the cathode 12 and the anode 14 are coupled in series by the fuse link 16. The cathode 12 has a larger area than the anode 14. Contact plugs 18 are disposed on the anode 14 to contact interconnections (not shown), and contact plugs 20 are disposed on the cathode 12 to contact interconnections (not shown).

A program voltage higher than a threshold voltage is applied to the cathode 12 and the anode 14 such that the electrical fuse is blown. Generally, a negative voltage is applied to the cathode 12, while a positive voltage is applied to the anode 14. Thus, electrical migration EM and thermal migrations TM1 and TM2 occur between the cathode 12 and the anode 14. Particularly, current crowding occurs at a boundary region A between the cathode 12 and the fuse link 16. The electrical migration occurs from the cathode 12 toward the anode 14.

Figure 2:
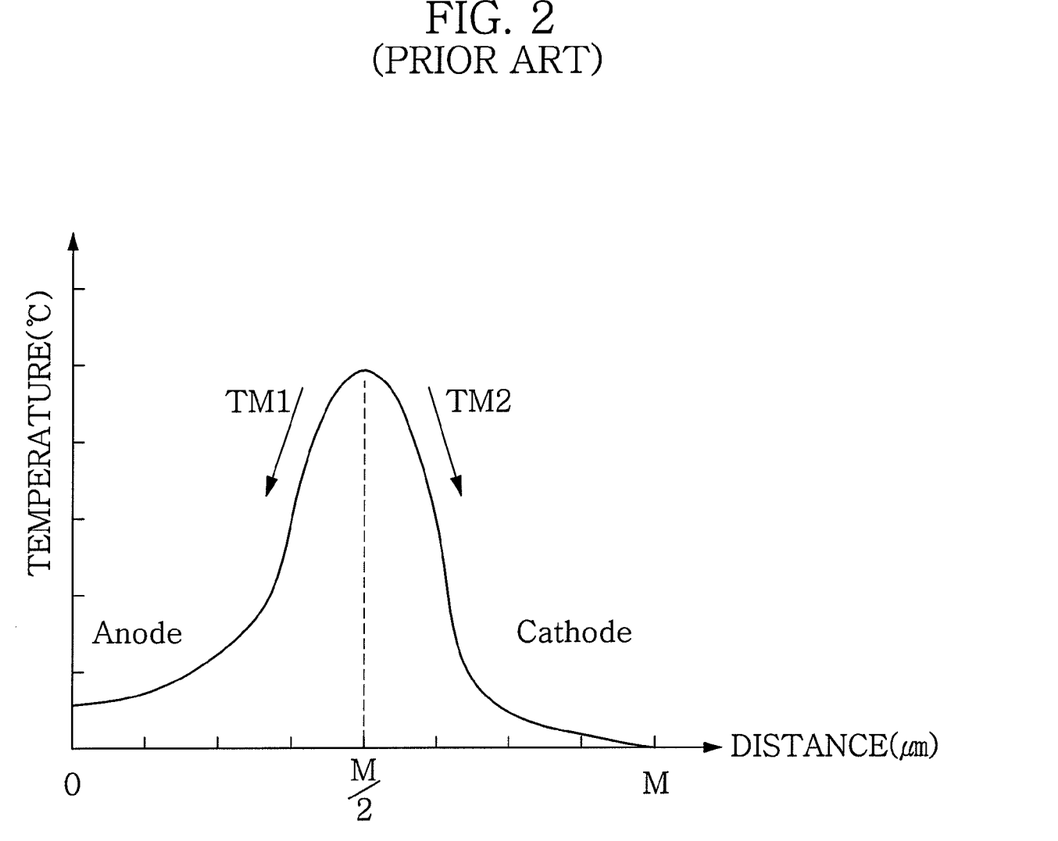
FIG. 2 is a graph illustrating the distribution of thermal migration that occurs by the application of a program voltage to the conventional electrical fuse shown in FIG. 1.

FIG. 2 is a graph illustrating the distribution of thermal migration that occurs by the application of a program voltage to the conventional electrical fuse shown in FIG. 1.

Referring to FIGS. 1 and 2, when a program voltage is applied to the conventional electrical fuse, first thermal migration TM1 occurs from the center M/2 of the fuse link 16 toward the anode 14, while second thermal migration TM2 occurs from the center M/2 of the fuse link 16 toward the cathode 12. The first thermal migration TM1 occurs in the same direction as the electrical migration EM. However, the second thermal migration TM2 occurs in an opposite direction to the electrical migration EM. Thus, the second thermal migration TM2 prevents the electrical fuse from being programmed (or blown). As a result, the reliability of the repair process deteriorates.

SUMMARY OF THE INVENTION

An exemplary embodiment of the present invention provides an electrical fuse that can maximize blowing efficiency.

An exemplary embodiment of the present invention provides a semiconductor device having an electrical fuse that can maximize blowing efficiency.

An exemplary embodiment of the present invention provides a method of programming and reading an electrical fuse that can improve the reliability of a repair process.

In an aspect of the present invention, an electrical fuse is used for maximizing blowing efficiency. The electrical fuse includes first and second anodes disposed apart from each other. A cathode is interposed between the first and second anodes. A first fuse link couples the first anode to the cathode, and a second fuse link couples the second anode to the cathode.

In some exemplary embodiments of the present invention, each of the first and second anodes may have a larger area than the cathode.

In some exemplary embodiments, each of the first and second fuse links may have a smaller width than each of the anodes and cathode.

In some exemplary embodiments, the anodes, the cathode, and the fuse links may include a polysilicon layer and a silicide layer that are sequentially stacked.

In an aspect of the present invention, a semiconductor device has an electrical fuse for maximizing blowing efficiency. The semiconductor device includes a semiconductor substrate. First and second anodes are disposed apart from each other on the semiconductor substrate. A cathode is interposed between the first and second anodes. A first fuse link couples the first anode to the cathode, and a second fuse link couples the second anode to the cathode. First and second interconnections are electrically connected to the first and second anodes, respectively. A third interconnection is electrically connected to the cathode.

In some exemplary embodiments of the present invention, the semiconductor device may further include a first insulating layer interposed between the first and second anodes and the substrate. The first insulating layer may be interposed between the first and second fuse links and the substrate. Also, the first insulating layer may be interposed between the cathode and the substrate.

In some exemplary embodiments, a second insulating layer may cover the semiconductor substrate having the first through third interconnections.

In some exemplary embodiments, the semiconductor may further include first through third contact plugs. The first contact plug may be disposed in the second insulating layer to contact the first interconnection and the first anode. The second contact plug may be disposed in the second insulating layer to contact the second interconnection and the second anode. Also, the third contact plug may be disposed in the second insulating layer to contact the third interconnection and the cathode.

In some exemplary embodiments, each of the first and second anodes may have a larger area than the cathode.

In some exemplary embodiments, each of the first and second fuse links may have a smaller width than each of the anodes and cathode.

In some exemplary embodiments, the anodes, the cathode, and the fuse links may include a polysilicon layer and a silicide layer that are sequentially stacked.

In an aspect of the present invention, a method of programming and reading an electrical fuse is provided. The method includes preparing a semiconductor substrate comprising first and second fuse terminals disposed apart from each other, a third fuse terminal interposed between the first and second fuse terminals, a first fuse link for coupling the first fuse terminal to the third fuse terminal, and a second fuse link for coupling the second fuse terminal to the third fuse terminal. First and second voltages are applied to the first and second fuse terminals, respectively, and a third voltage lower than the first and second voltages is applied to the third fuse terminal to blow at least one of the first fuse link and the second fuse link. The application of the first through third voltages is interrupted. A fourth voltage is applied to the first fuse terminal and a fifth voltage lower than the fourth voltage is applied to the second fuse terminal to sense the resistance of the electrical fuse.

In some exemplary embodiments of the present invention, each of the first and second fuse terminals may be formed to have an area larger than the area of the third fuse terminal.

In some exemplary embodiments, each of the first and second fuse links may be formed to have a width smaller than the width of each of the first through third fuse terminals.

In some exemplary embodiments, the first through third fuse terminals and the first and second fuse links may be formed by sequentially stacking a polysilicon layer and a silicide layer.

BRIEF DESCRIPTION OF THE DRAWINGS

These and/or other aspects and features of the exemplary embodiments of the present invention will become more apparent and more readily appreciated from the following description, taken in conjunction with the accompanying drawings of which.

DETAILED DESCRIPTION OF EXEMPLARY EMBODIMENTS

Exemplary embodiments of the present invention will now be described more fully hereinafter with reference to the accompanying drawings, in which exemplary embodiments of the invention are shown. This invention may, however, be embodied in different forms and should not be construed as limited to the exemplary embodiments set forth herein. The same reference numerals may be used to denote the same elements throughout the specification. In the drawings, the thicknesses of layers and regions may be exaggerated for clarity. The drawings are not intended to be drawn to scale. It will also be understood that when a layer is referred to as being "on" another layer or substrate, it can be directly on the other layer or substrate or intervening layers may also be present.

Figure 3:
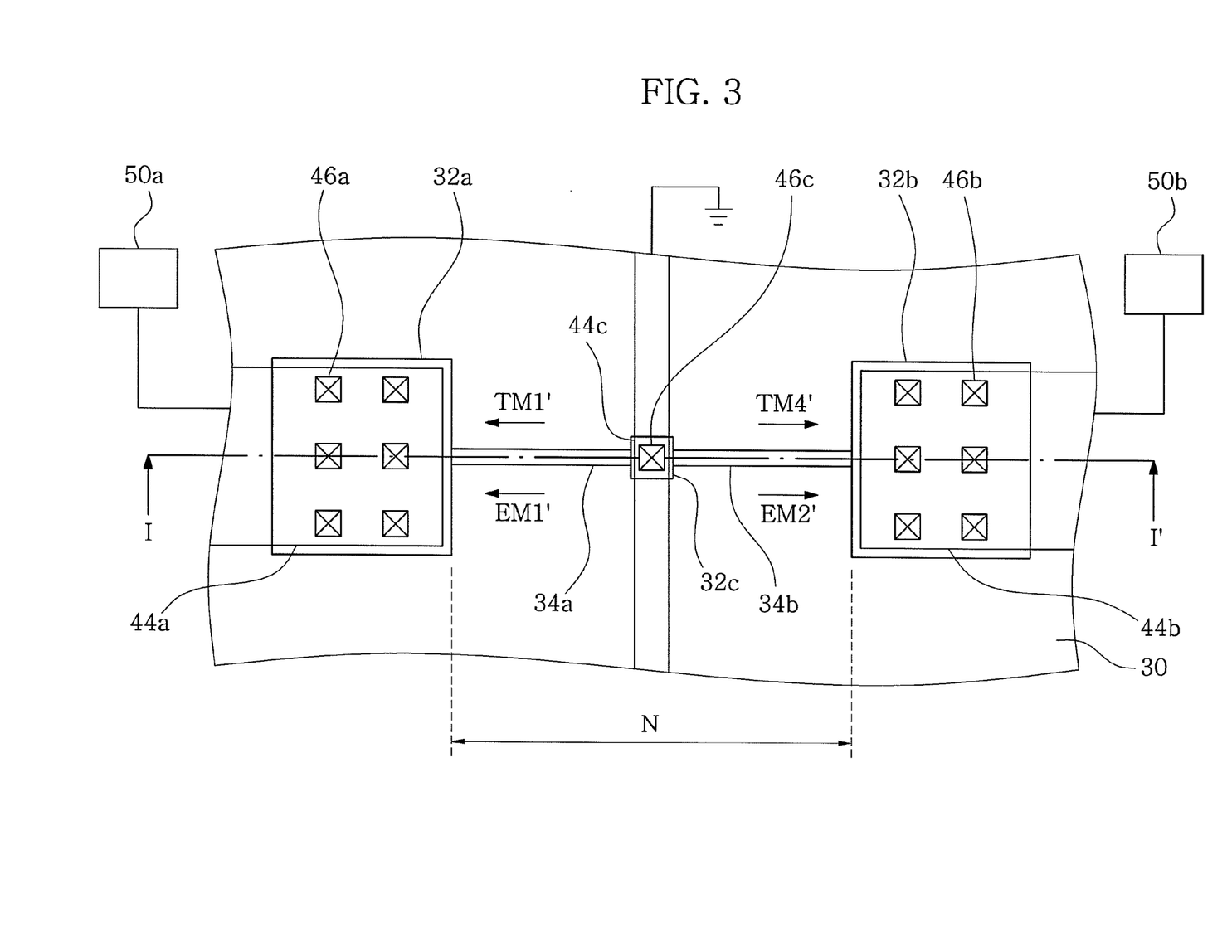
FIG. 3 is a plan view of an electrical fuse according to an exemplary embodiment of the present invention.
Figure 4:
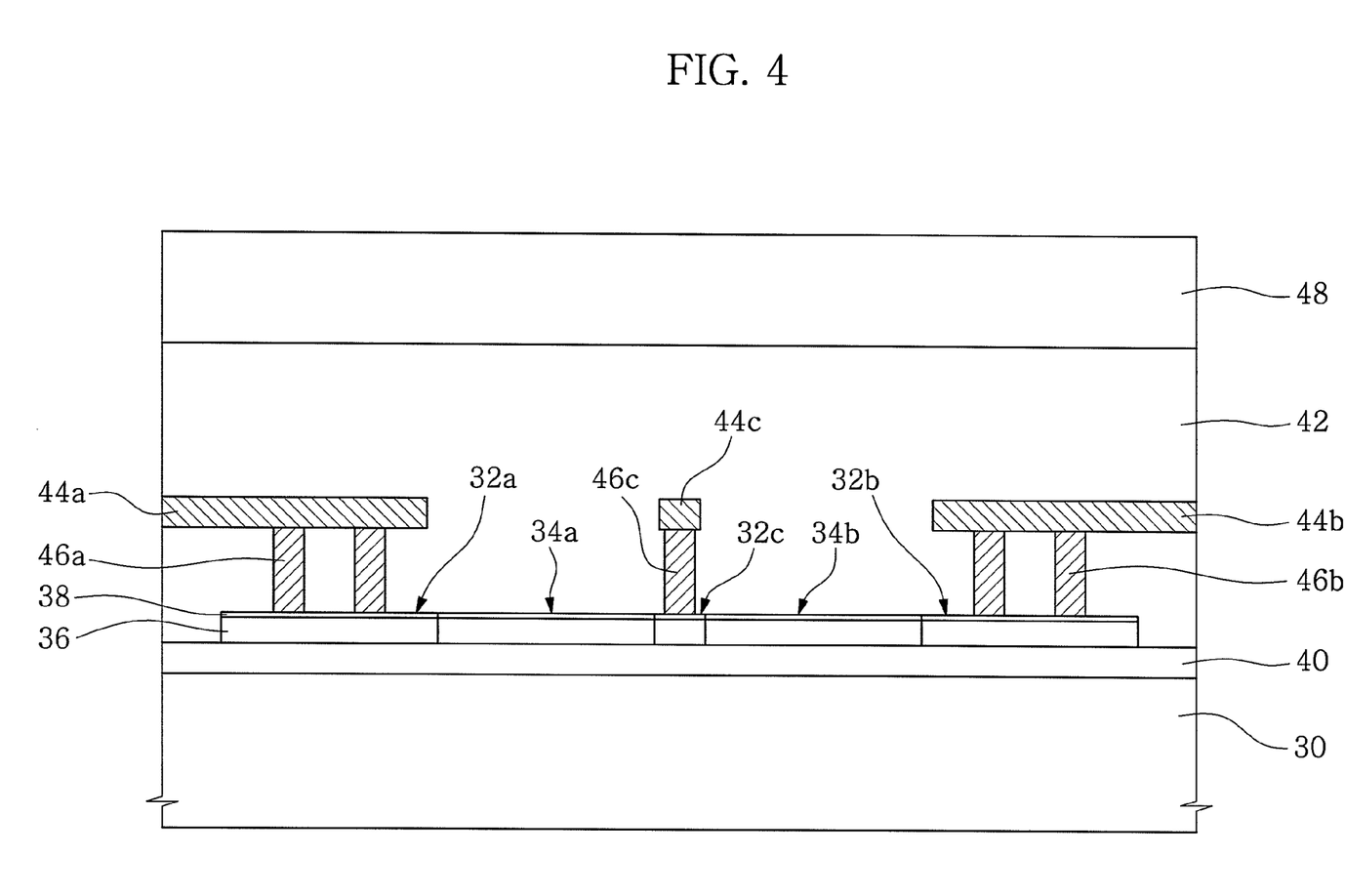
FIG. 4 is a cross-sectional view taken along line I-I' of FIG. 3, which illustrates an electrical fuse according to an exemplary embodiment of the present invention.
Figure 5:
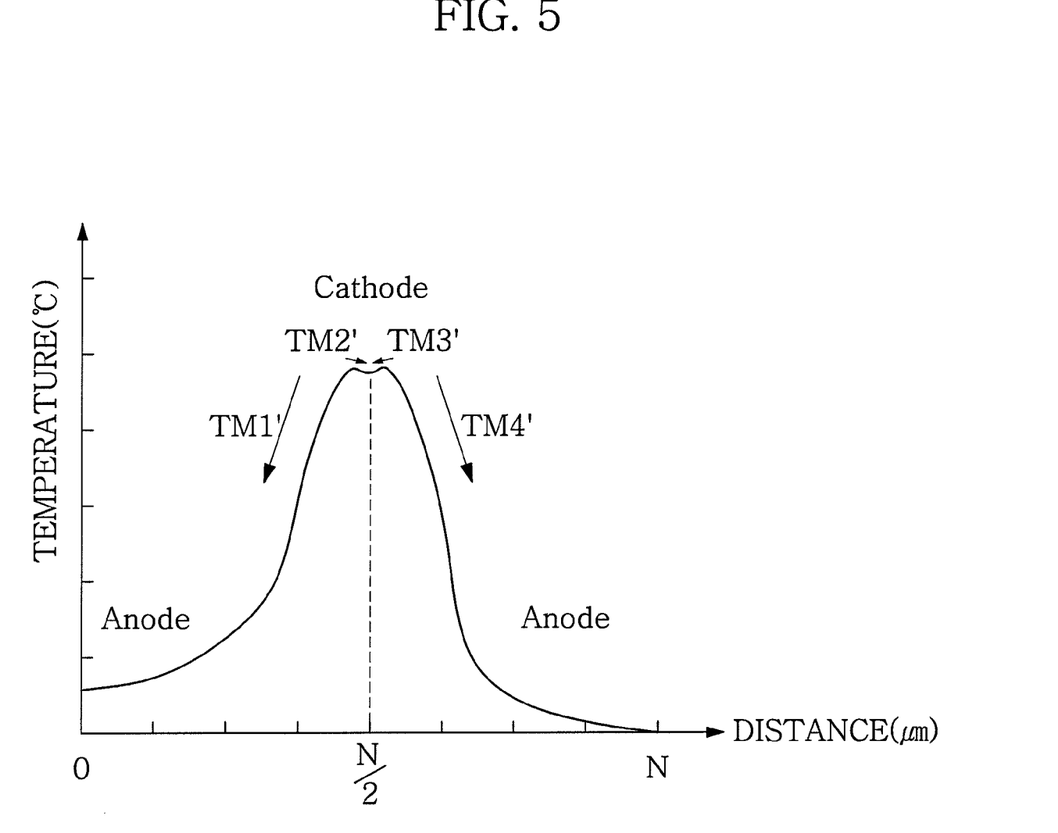
FIG. 5 is a graph illustrating the distribution of thermal migration that occurs by the application of a program voltage to the electrical fuse shown in FIG. 3.
Figure 6:
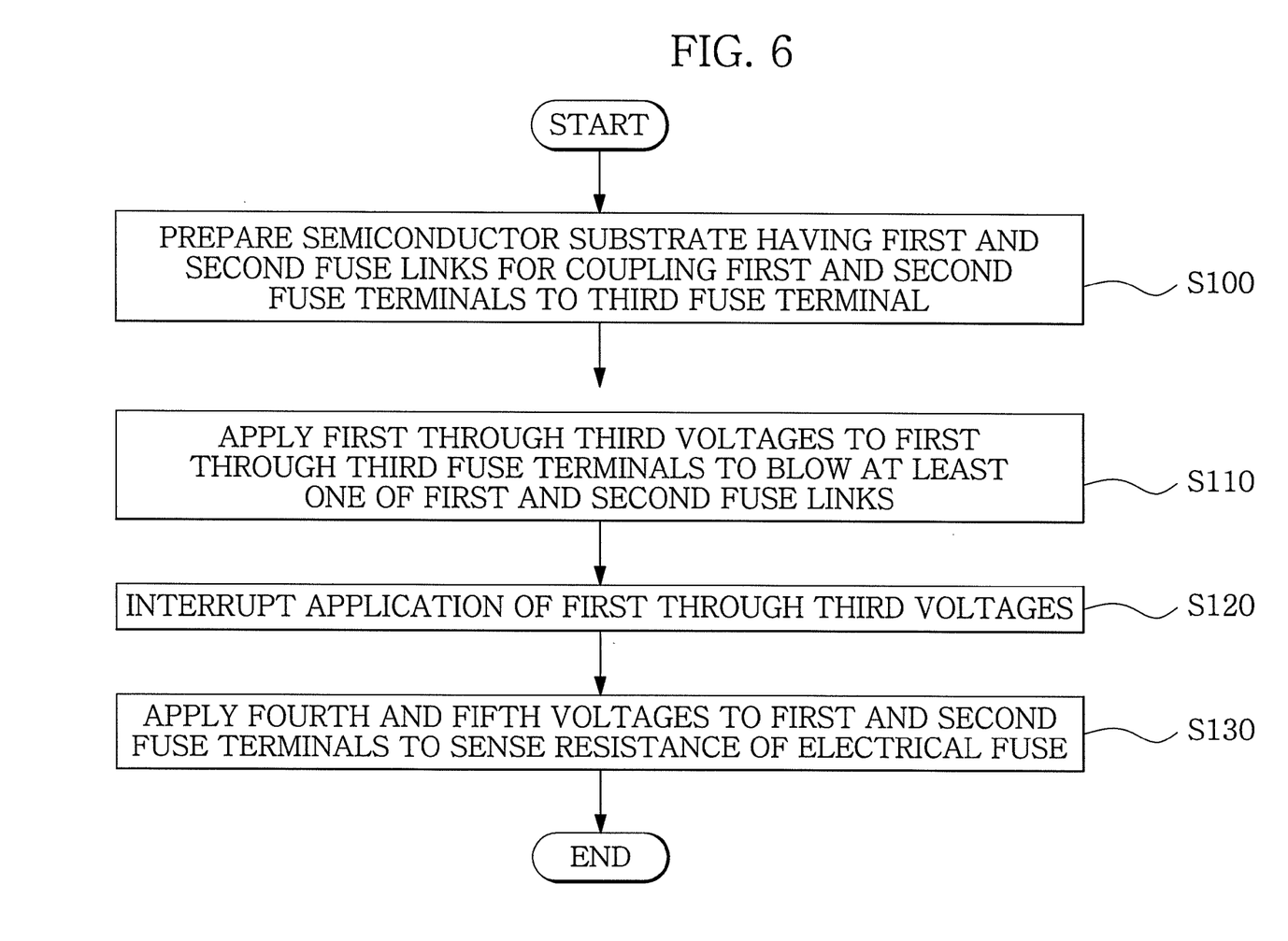
FIG. 6 is a flowchart illustrating a method of programming and reading the electrical fuse according to an exemplary embodiment of the present invention.

FIG. 3 is a plan view of an electrical fuse according to an exemplary embodiment of the present invention. FIG. 4 is a cross-sectional view taken along line I-I' of FIG. 3, which illustrates an electrical fuse according to an exemplary embodiment of the present invention. FIG. 5 is a graph illustrating the distribution of thermal migration that occurs by the application of a program voltage to the electrical fuse shown in FIG. 3. FIG. 6 is a flowchart illustrating a method of programming and reading the electrical fuse according to an exemplary embodiment of the present invention.

Referring to FIGS. 3 and 4, an electrical fuse according to an exemplary embodiment of the present invention is disposed on a semiconductor substrate 30. The electrical fuse includes a first fuse terminal 32a and a second fuse terminal 32b that are spaced apart from each other. The first and second fuse terminals 32a and 32b may be anodes. Also, the electrical fuse includes a third fuse terminal 32c that is interposed between the first and second fuse terminals 32a and 32b. When the first and second fuse terminals 32a and 32b are anodes, the third fuse terminal 32c may be a cathode. Furthermore, the electrical fuse includes a first fuse link 34a and a second fuse link 34b. The first fuse link 34a combines the first fuse terminal 32a with the third fuse terminal 32c, while the second fuse link 34b combines the third fuse terminal 32c with the second fuse terminal 32b. Thus, the first through third fuse terminals 32a, 32b, and 32c may be coupled in series by the first and second fuse links 34a and 34b.

The first through third fuse terminals 32a, 32b, 32c and the first and second fuse links 34a and 34b may include a polysilicon layer 36 and a silicide layer 38 that are sequentially stacked. Generally, the polysilicon layer 36 may have a higher electrical resistance than the silicide layer 38. The silicide layer 38 may be a cobalt silicide layer, a tungsten silicide layer, or a nickel silicide layer.

Also, each of the first and second fuse terminals 32a and 32b may have a larger area than the third fuse terminal 32c. Furthermore, each of the first and second fuse links 34a and 34b may have a smaller width than each of the first through third fuse terminals 32a, 32b, and 32c.

A first insulating layer 40 may be interposed between the semiconductor substrate 30 and the electrical fuse. Thus, the first through third fuse terminals 32a, 32b, and 32c and the first and second fuse links 34a and 34b may be electrically insulated from the semiconductor substrate 30. The first insulating layer 40 may be a silicon oxide layer or a silicon nitride layer. When the first insulating layer 40 is a silicon oxide layer, the silicon oxide layer may be a thermal oxide layer.

A second insulating layer 42 may be disposed on the semiconductor substrate 30 having the electrical fuse. For example, the electrical fuse may be disposed in the second insulating layer 42. The second silicon layer 42 may be a silicon oxide layer or a silicon nitride layer.

First and second interconnections 44a and 44b may be disposed on the first and second fuse terminals 32a and 32b, respectively. Similarly, a third interconnection 44c may be disposed on the third fuse terminal 32c. In this case, the first through third interconnections 44a, 44b, and 44c may be disposed in the second insulating layer 42. The first through third interconnections 44a, 44b, and 44c may be disposed at the same level. Also, the first through third interconnections 44a, 44b, and 44c may be formed of a metal layer, such as a copper layer or an aluminum layer.

At least one first contact plug 46a may be disposed in the second insulating layer 42 to couple the first fuse terminal 32a to the first interconnection 44a. Similarly, at least one second contact plug 46b may be disposed in the second insulating layer 42 to couple the second fuse terminal 32b to the second interconnection 44b. Also, a third contact plug 46c may be disposed in the second insulating layer 42 to couple the third fuse terminal 32c to the third interconnection 44c. The first through third contact plugs 46a, 46b, and 46c may be formed of a metal layer, such as a copper layer or an aluminum layer. A plurality of first contact plugs 46a may be formed. Also, a plurality of second contact plugs 46b may be formed. The third contact plug 46c may be a single plug. When a single third contact plug 46c is formed, the third contact plug 46c may have a larger sectional area than a conventional contact plug and come into contact with the third fuse terminal 32c. A passivation layer 48 may be disposed on the second insulating layer 42.

Hereinafter, a method of programming and reading the above-described electrical fuse will be described.

Referring to FIGS. 3 through 6, a semiconductor substrate is prepared in step S100. The substrate has first and second fuse terminals 32a and 32b, which are spaced apart from each other. A third fuse terminal 32c is interposed between the first and second fuse terminals 32a and 32b. A first fuse link 34a combines the first fuse terminal 32a with the third fuse terminal 32c, and a second fuse link 34b combines the second fuse terminal 32b with the third fuse terminal 32c.

First and second voltages are respectively applied from first and second power supplies 50a and 50b, which are electrically coupled to the first and second fuse terminals 32a and 32b respectively, to the first and second fuse terminals 32a and 32b in step S110. In this case, the first voltage may be equal to the second voltage. Also, a third voltage, which is lower than each of the first and second voltages, may be applied to the third fuse terminal 32c in step S110. For example, a program voltage is applied to the fuse terminals 32a, 32b, and 32c. In this case, positive voltages may be applied to the first and second fuse terminals 32a and 32b, while a negative voltage may be applied to the third fuse terminal 32c. Alternatively, the third fuse terminal 32c may be grounded. A difference between the first and third voltages and a difference between the second and third voltages may be greater than a predetermined threshold voltage. For example, the first through third voltages are applied to the first through third fuse terminals 32a, 32b, and 32c such that the electrical fuse can be blown. In this case, at least one of the first and second fuse links 34a and 34b may be blown. For example, when at least one of the first and second fuse links 34a and 34b is blown, the electrical fuse may be completely blown. For example, even if a blowing failure occurs in the first fuse link 34a, when the second fuse link 34b is blown, it is decided that the electrically fuse is completely blown. When the first and second fuse terminals 32a and 32b are anodes, the third fuse terminal 32c may be a cathode.

Thus, electrical migration occurs from the third fuse terminal 32c toward the first and second fuse terminals 32a and 32b. Also, thermal migrations TM1' and TM4' occurs from the third fuse terminal 32c toward the first and second fuse terminals 32a and 1032b. In this case, thermal migrations TM2' and TM3' that occur from the first and second fuse terminals 32a and 32b toward the third fuse terminal 32c are negligible. As a result, dominant thermal migrations TM1' and TM4' occur in the same direction as the electrical migration. Thus, the blowing efficiency of the electrical fuse can be improved.

A method of reading the above-described electrical fuse will now be described in more detail.

The application of the first through third voltages to the first through third fuse terminals 32a, 32b, and 32c is interrupted in step S120. In this case, the third fuse terminal 32c is electrically insulated from a power supply (not shown) for supplying power to the third fuse terminal 32c. Next, a fourth voltage is applied from the first power supply 50a to the first fuse terminal 32a, and a fifth voltage lower than the fourth voltage is applied from the second power supply 50b to the second fuse terminal 32b in step S130. In this case, each of the fourth and fifth voltages may differ from each of the first and second voltages. Also, the fourth voltage may be a positive voltage, while the fifth voltage may be a negative voltage. Thus, a reading voltage may be applied to the first and second fuse terminals 32a and 32b to sense the resistance of the electrical fuse in step S130. Whether the electrical fuse is blown or not may depend on the sensed resistance of the electrical fuse. In this case, the first fuse terminal 32a may function as an anode, the second fuse terminal 32b may function as a cathode, and the third fuse terminal 32c may function as a dummy terminal. Thus, whether the first and second fuse links 34a and 34b are blown or not can be determined. When at least one of the first and second fuse links 34a and 34b is blown, it is determined that the electrical fuse is blown.

According to the exemplary embodiments of the present invention as described above, an electrical fuse is configured such that anodes are spaced apart from each other, a cathode is interposed between the anodes, and the anodes and the cathode are coupled in series by fuse links. As a result, the blowing reliability of the electrical fuse can be increased.

Exemplary embodiments of the present invention have been disclosed herein. It will be understood by those of ordinary skill in the art that various changes in form and details may be made without departing from the spirit and scope of the present invention.

What is claimed is:

1. An electrical fuse comprising:
   first and second anodes disposed apart from each other;
   a cathode interposed between the first and second anodes;
   a first fuse link for coupling the first anode to the cathode; and
   a second fuse link for coupling the second anode to the cathode,
   wherein each of the first and second anodes has a larger area than the cathode.

2. An electrical fuse comprising:
   first and second anodes disposed apart from each other;
   a cathode interposed between the first and second anodes;
   a first fuse link for coupling the first anode to the cathode; and
   a second fuse link for coupling the second anode to the cathode,
   wherein each of the first and second fuse links has a smaller width than each of the anodes and cathode.

3. An electrical fuse comprising:
   first and second anodes disposed apart from each other;
   a cathode interposed between the first and second anodes;
   a first fuse link for coupling the first anode to the cathode; and
   a second fuse link for coupling the second anode to the cathode,
   wherein the anodes, the cathode, and the fuse links comprise a polysilicon layer and a silicide layer that are sequentially stacked.

4. A semiconductor device comprising:
a semiconductor substrate;
first and second anodes disposed apart from each other on the semiconductor substrate;
a cathode interposed between the first and second anodes;
a first fuse link for coupling the first anode to the cathode;
a second fuse link for coupling the second anode to the cathode;
first and second interconnections electrically connected to the first and second anodes, respectively; and
a third interconnection electrically connected to the cathode, and
further comprising a second insulating layer covering the semiconductor substrate having the first through third interconnections.

5. The device according to claim 4, further comprising a first insulating layer interposed between the first and second anodes and the substrate, between the first and second fuse links and the substrate, and between the cathode and the substrate.

6. The device according to claim 4, further comprising:
a first contact plug disposed in the second insulating layer to contact the first interconnection and the first anode;
a second contact plug disposed in the second insulating layer to contact the second interconnection and the second anode; and
a third contact plug disposed in the second insulating layer to contact the third interconnection and the cathode.

7. The device according to claim 4, wherein each of the first and second anodes has a larger area than the cathode.

8. The device according to claim 4, wherein each of the first and second fuse links has a smaller width than each of the anodes and cathode.

9. A semiconductor device comprising:
a semiconductor substrate;
first and second anodes disposed apart from each other on the semiconductor substrate;
a cathode interposed between the first and second anodes;
a first fuse link for coupling the first anode to the cathode;
a second fuse link for coupling the second anode to the cathode;
first and second interconnections electrically connected to the first and second anodes, respectively; and
a third interconnection electrically connected to the cathode, and
wherein the anodes, the cathode, and the fuse links comprise a polysilicon layer and a silicide layer that are sequentially stacked.

10. The device according to claim 4, wherein the first through third interconnections are disposed at the same level.

11. The device according to claim 9, further comprising a first insulating layer interposed between the first and second anodes and the substrate, between the first and second fuse links and the substrate, and between the cathode and the substrate.

12. The device according to claim 9, wherein each of the first and second anodes has a larger area than the cathode.

13. The device according to claim 9, wherein each of the first and second fuse links has a smaller width than each of the anodes and cathode.

14. The device according to claim 9, wherein the first through third interconnections are disposed at the same level.

* * * * *